(12) United States Patent
Chen et al.

(10) Patent No.: US 11,133,786 B2
(45) Date of Patent: Sep. 28, 2021

(54) RADIO FREQUENCY POWER AMPLIFIER MODULE HAVING HIGH LINEARITY AND POWER-ADDED EFFICIENCY AND IMPLEMENTATION METHOD

(71) Applicant: VANCHIP (TIANJIN) TECHNOLOGY CO., LTD., Tianjin (CN)

(72) Inventors: Gang Chen, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 13 days.

(21) Appl. No.: 16/621,682

(22) PCT Filed: Jul. 1, 2018

(86) PCT No.: PCT/CN2018/093939
§ 371 (c)(1),
(2) Date: Dec. 11, 2019

(87) PCT Pub. No.: WO2018/228603
PCT Pub. Date: Dec. 20, 2018

(65) Prior Publication Data
US 2020/0195209 A1 Jun. 18, 2020

(30) Foreign Application Priority Data

Jun. 12, 2017 (CN) .......................... 201710440232.2

(51) Int. Cl.
*H03F 1/30* (2006.01)
*H03F 3/24* (2006.01)
(Continued)

(52) U.S. Cl.
CPC .......... *H03F 3/245* (2013.01); *H03F 1/0255* (2013.01); *H03F 3/195* (2013.01); *H03F 2200/451* (2013.01)

(58) Field of Classification Search
CPC ................ H03F 1/30; H03F 3/20; H03G 3/30
(Continued)

(56) References Cited

U.S. PATENT DOCUMENTS

| 5,914,634 A | 6/1999 | Oberhammer | |
| 8,183,925 B2 * | 5/2012 | Ohta | H03F 3/195 |
| | | | 330/285 |
| 9,473,076 B2 * | 10/2016 | Ni | H03F 3/19 |

FOREIGN PATENT DOCUMENTS

| CN | 103138690 A | 6/2013 |
| CN | 103166581 A | 6/2013 |

(Continued)

OTHER PUBLICATIONS

International Search Report in the international application No. PCT/CN2018/093939, dated Sep. 3, 2018.
(Continued)

*Primary Examiner* — Henry Choe
(74) *Attorney, Agent, or Firm* — Ladas & Parry, LLP

(57) ABSTRACT

Disclosed are a radiofrequency power amplifier module having high linearity and power-added efficiency and an implementation method. The radiofrequency power amplifier module comprises a bias circuit, a linearization circuit, and a power amplifier circuit. The power amplifier circuit is connected to the linearization circuit. The linearization circuit is connected to the bias circuit. The bias circuit is connected to the power amplifier circuit. In the present invention, the linearization circuit is utilized to capture a radiofrequency signal inputted from a radiofrequency signal input end of the power amplifier circuit, the captured radiofrequency signal is fed back to the bias circuit, a correspond-
(Continued)

ing bias current is generated by the bias circuit on the basis of the radiofrequency signal fed back, and the bias current is inputted to the power amplifier circuit, thus increasing the linearity and power-added efficiency of an output signal of the radiofrequency power amplifier.

7 Claims, 13 Drawing Sheets

(51) Int. Cl.
 *H03F 1/02* (2006.01)
 *H03F 3/195* (2006.01)
(58) Field of Classification Search
 USPC .................................................. 330/296, 285
 See application file for complete search history.

(56) References Cited

FOREIGN PATENT DOCUMENTS

| | | |
|---|---|---|
| CN | 106452377 A | 2/2017 |
| CN | 107395130 A | 11/2017 |

OTHER PUBLICATIONS

International Preliminary Report on Patentability in the international Application No. PCT/CN2018/093939, dated Dec. 17, 2019.
Lavrador, P.M. et al. "The Linearity-Efficiency Compromise" IEEE Microwave Magazine, Aug. 31, 2010.

* cited by examiner

RADIO FREQUENCY POWER AMPLIFIER MODULE HAVING HIGH LINEARITY AND POWER-ADDED EFFICIENCY AND IMPLEMENTATION METHOD

CROSS-REFERENCE TO RELATED APPLICATIONS

This application is a national phase application of International Patent Application No. PCT/CN2018/093939, filed on Jul. 1, 2018, which claims priority to Chinese Application No. 201710440232.2, filed on Jun. 12, 2017, the contents of which are hereby incorporated by reference in their entireties.

BACKGROUND

Technical Field

The present invention relates to a radio frequency power amplifier module (called as an RFPA module for short) having high linearity and power-added efficiency, also relates to a method for improving linearity and power-added efficiency of a radio frequency power amplifier module, and belongs to the technical field of radio frequency integrated circuits.

Related Art

A radio frequency power amplifier (RFPA) is widely applied to wireless communication equipment such as a mobile phone. In a pre-stage circuit of a transmitter, the power of a radio frequency signal generated by a modulation oscillator circuit is very low, and needs to be amplified by the RFPA, and the signal can be fed back to an antenna to be radiated out after sufficient radio frequency power is obtained. In addition, in a transmission process of the radio frequency signal, better linearity and power-added efficiency need to be maintained. In the process, well control over the linearity is important for ensuring a transmission speed of wireless communication, and higher power-added efficiency can help to prolong the service time of the wireless communication equipment.

At present, various mobile communication standards or wireless communication standards, such as WCDMA, TD-LTE and Wi-Fi exist in the market. Modulation signals under those communication standards have a same common characteristic that in a certain time period, the power of the signal can change, i.e., a signal amplitude of the radio frequency signal in a modulation mode can randomly change. If the radio frequency power amplifier cannot perform equal-amplitude amplification on the radio frequency signal, a phenomenon of linearity worsening can occur. For specific performance, during the radio frequency signal transmission of the radio frequency power amplifier, if a power gain curve of the radio frequency power amplifier greatly changes along with an increase of the signal input power, the linearity of an output signal of the radio frequency power amplifier fast worsens. At present, each communication standard requires the radio frequency power amplifier to be capable of maintaining better linearity.

The operating state of the radio frequency power amplifier can be divided into a plurality of power sections. Different power sections can optimize the linearity and power-added efficiency by regulating the characteristics of the radio frequency power amplifier. In the prior art, a conventional scheme for improving the linearity of the low power section and the middle power section of the radio frequency power amplifier is to increase a quiescent operating current of the radio frequency power amplifier. A conventional scheme for improving the linearity of the high power section of the radio frequency power amplifier is to increase a dynamic operating current of the radio frequency power amplifier. By using the technical schemes, the power-added efficiency can be reduced when the radio frequency power amplifier operates, so that heating of the radio frequency power amplifier is caused, and the service time of a battery is reduced. Therefore, it is one of design difficulties of the current radio frequency power amplifier to increase the power-added efficiency while the radio frequency power amplifier is enabled to obtain high linearity.

SUMMARY

The primary technical problem to be solved by the present invention is to provide a radio frequency power amplifier module having high linearity and power-added efficiency.

Another technical problem to be solved by the present invention is to provide a method for improving linearity and power-added efficiency of a radio frequency power amplifier module.

In order to achieve the goals, the present invention adopts the following technical scheme:

According to a first aspect of embodiments of the present invention, a radio frequency power amplifier module having high linearity and power-added efficiency is provided. The radio frequency power amplifier module includes a bias circuit, a linearization circuit and a power amplifier circuit. The power amplifier circuit is connected to the linearization circuit. The linearization circuit is connected to the bias circuit. The bias circuit is connected to the power amplifier circuit.

Energy of a radio frequency signal fed back to the bias circuit is controlled through the linearization circuit, and the intensity of a bias current output by the bias circuit is further regulated.

Preferably, the linearization circuit consists of a second capacitor, or the linearization circuit is formed by connecting any one of a resistor, an inductor and a third diode to the second capacitor in series, or the linearization circuit is formed by connecting the second capacitor and the resistor in parallel.

Preferably, the second capacitor is any one of a metal coupling capacitor, a metal insulation capacitor and a stack capacitor.

Preferably, the bias circuit includes a first diode, a second diode, a first capacitor, a passing element and a ballast resistor. An anode of the first diode is respectively connected to a first external bias voltage, one end of the first capacitor and a base of the passing element. A cathode of the first diode is connected to an anode of the second diode. A cathode of the second diode and other end of the first capacitor are respectively grounded. A collector of the passing element is connected to a second external bias voltage. An emitter of the passing element is connected to one end of the ballast resistor. An output end of the linearization circuit is connected to the bias circuit through a first node in the bias circuit.

Preferably, the power amplifier circuit includes a third capacitor and a power transistor. One end of the third capacitor is connected to a radio frequency signal input end, other end of the third capacitor is connected to a base of the power transistor. A collector of the power transistor is respectively connected to an external power supply voltage and a radio frequency signal output end through a second node. An emitter of the power transistor is grounded. The power amplifier circuit is respectively connected to an input end of the linearization circuit and an output end of the bias circuit through a third node and a fourth node in the power amplifier circuit.

Preferably, the passing element or the power transistor includes but is not limited to any one of a heterojunction bipolar transistor, a high-electron-mobility transistor or a pseudomorphic high-electron-mobility transistor, and a bipolar junction transistor.

Preferably, the bias circuit, the linearization circuit and the power amplifier circuit are respectively and correspondingly arranged on one or a plurality of chips. When the bias circuit and the power amplifier circuit are respectively arranged on two chips, a chip on which the bias circuit is located and a chip on which the power amplifier circuit is located are connected to the linearization circuit in a bridging or serial connection mode.

Preferably, when the radio frequency power amplifier module is a multi-stage radio frequency power amplifier, at least one stage of radio frequency power amplifier is provided with the linearization circuit.

According to a second aspect of the embodiments of the present invention, a method for improving linearity and power-added efficiency of a radio frequency power amplifier module is provided. The method includes the following steps of:

Step S1, capturing a radio frequency signal through a linearization circuit, and feeding back the radio frequency signal to a bias circuit; and Step S2, generating a corresponding bias current according to the fed back radio frequency signal by the bias circuit, and inputting the bias current into a power amplifier circuit so as to increase the linearity and power-added efficiency of an output signal of the radio frequency power amplifier module.

Preferably, energy of the radio frequency signal fed back to the bias circuit is controlled through the linearization circuit, and the intensity of a bias current output by the bias circuit is further regulated.

The linearization circuit is arranged between the power amplifier circuit and the bias circuit, the energy of the radio frequency signal fed back to the bias circuit under different conditions is controlled by using linearization circuits in different structures, and the intensity of the bias current output by the bias circuit is further regulated, so that nonlinear energy generated when the power amplifier circuit amplifies the radio frequency signal is inhibited, and the linearity and power-added efficiency of the output signal of the radio frequency power amplifier module are increased. The radio frequency power amplifier module and the implementation method provided by the present invention can be applied to a multi-stage radio frequency power amplifier, thus effectively improving the linearity and power-added efficiency of the multi-stage radio frequency power amplifier.

DETAILED DESCRIPTION

The following further describes the technical content of the present invention with reference to the accompanying drawings and specific embodiments.

Figure 1:
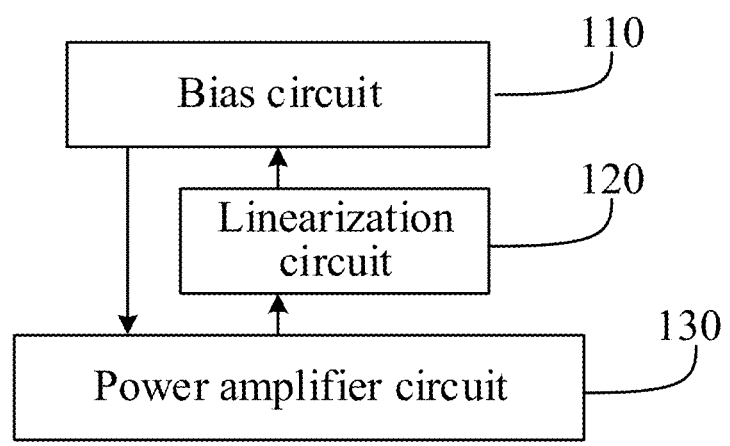
FIG. 1 is a schematic structure diagram of a radio frequency power amplifier module having high linearity and power-added efficiency provided by the present invention.

As shown in FIG. 1, a radio frequency power amplifier module provided by the present invention includes a bias circuit 110, a linearization circuit 120 and a power amplifier circuit 130. The power amplifier circuit 130 is connected to the linearization circuit 120. The linearization circuit 120 is connected to the bias circuit 110. The bias circuit 110 is connected to the power amplifier circuit 130. A captured radio frequency signal (i.e. a radio frequency input signal) of the power amplifier circuit 130 is fed back to the bias circuit 110 through the linearization circuit 120. A corresponding bias current value is generated after the radio frequency signal is processed by the bias circuit 110. The bias current value is input into the power amplifier circuit 130, the nonlinear energy generated when the power amplifier circuit 130 amplifies the radio frequency signal can be inhibited, and the linearity and power-added efficiency of an output signal of the whole radio frequency power amplifier module can be increased, so that a transmission speed of wireless communication is increased, and the service time of wireless communication equipment is prolonged.

Figure 2:
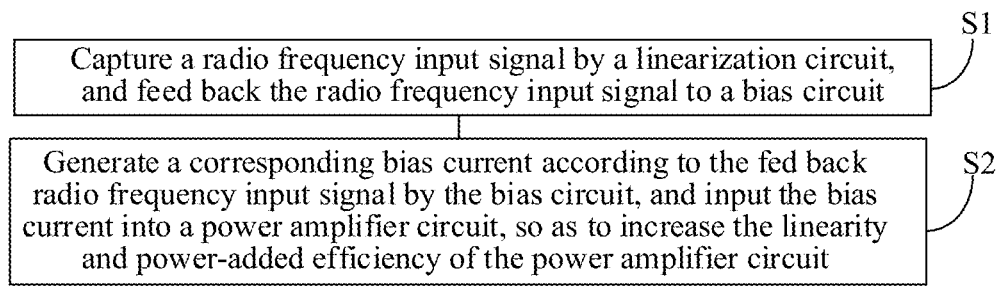
FIG. 2 is a schematic diagram of implementation steps for improving the linearity and power-added efficiency of the radio frequency power amplifier module in FIG. 1.

On the basis of the radio frequency power amplifier module provided by the present invention, the present invention further provides a method for improving linearity and power-added efficiency of a radio frequency power amplifier module, as shown in FIG. 2. The method includes the following steps that:

Step S1, a radio frequency signal is captured through a linearization circuit, and is fed back to a bias circuit;

a radio frequency signal from an input end of a power amplifier can be captured through the linearization circuit 120, and is fed back to the bias circuit 110 connected to the linearization circuit 120, and the radio frequency signal is further processed through the bias circuit 110.

Step S2, the bias circuit can generate a corresponding bias current according to the fed back radio frequency signal, and the bias current is input to a power amplifier circuit, so that linearity and power-added efficiency of an output signal of the radio frequency power amplifier module are increased.

The radio frequency signal fed back by the linearization circuit 120 is received through the bias circuit 110. In addition, the bias circuit 110 can generate the corresponding bias current according to the received radio frequency signal. The bias current is input into the power amplifier circuit 130 through an output end of the bias circuit 110, so that the power amplifier circuit 130 achieves the goal of improving the linearity and power-added efficiency of the output signal of the radio frequency power amplifier module at multi-power level.

The radio frequency power amplifier module having high linearity and power-added efficiency and the implementation method provided by the present invention will be illustrated in detail through different embodiments hereafter with reference to FIG. 3-FIG. 11.

Embodiment 1

Figure 3:
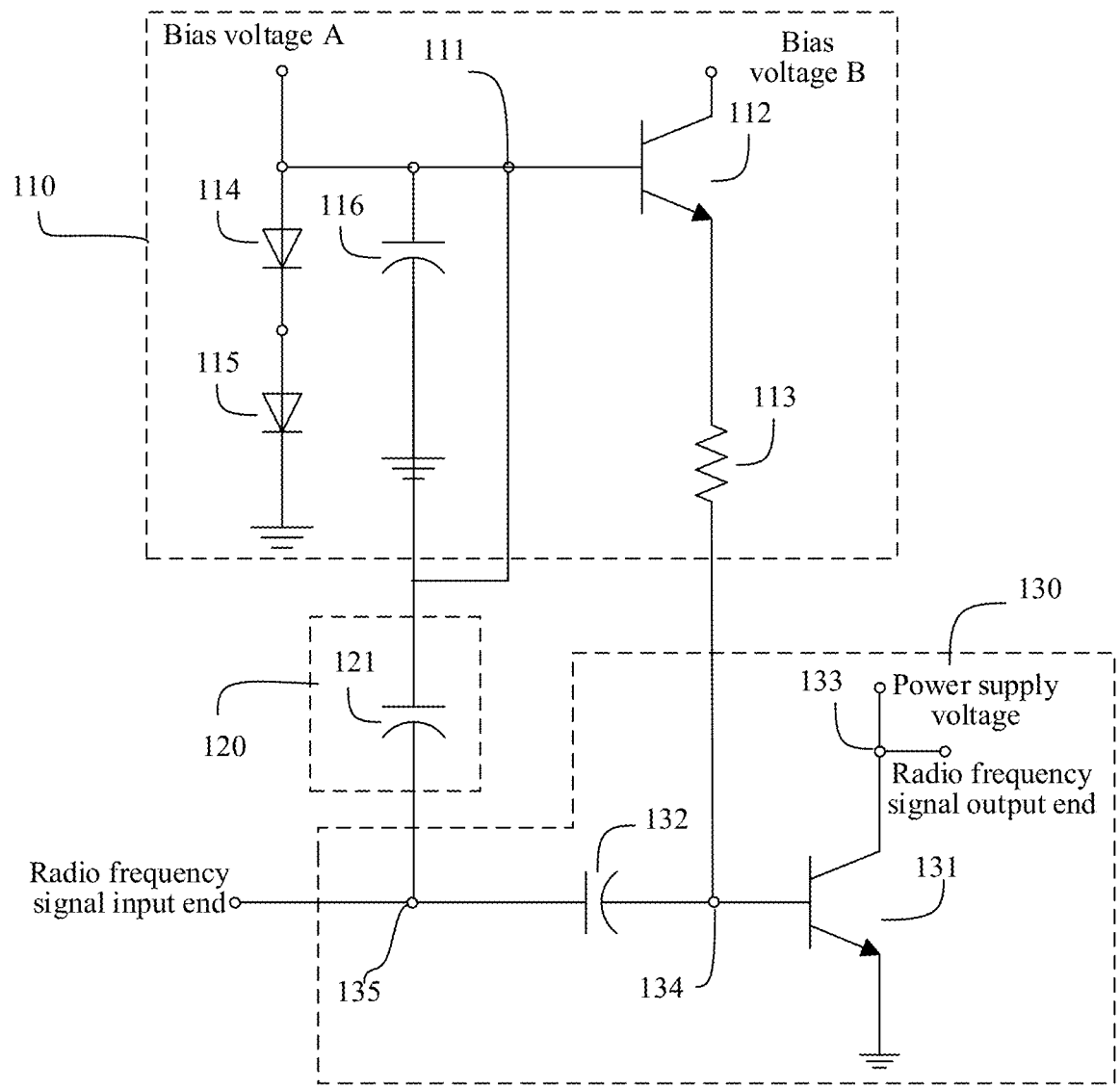
FIG. 3 is a schematic structure diagram of a circuit of a radio frequency power amplifier module provided by Embodiment 1.

As shown in FIG. 3, the radio frequency power amplifier module provided by the present embodiment includes a bias circuit 110, a linearization circuit 120 and a power amplifier circuit 130, wherein the bias circuit 110 includes a first diode 114, a second diode 115, a first capacitor 116, a passing element 112 and a ballast resistor 113. The passing element 112 can be any one of a heterojunction bipolar transistor (HBT), a high-electron-mobility transistor (HEMT) or a pseudomorphic high-electron-mobility transistor (p-HEMT) manufactured on a GaAs substrate or a SiGe substrate. Additionally, the passing element 112 can also be a bipolar junction transistor (BJT). A connection relationship among all components in the bias circuit 110 is shown as follows: an anode of the first diode 114 is respectively connected to a first external bias voltage A, one end of the first capacitor 116 and a base of the passing element 112, a cathode of the first diode 114 is connected to an anode of the second diode 115, a cathode of the second diode 115 and the other end of the first capacitor 116 are respectively grounded, a collector of the passing element 112 is connected to a second external bias voltage B, an emitter of the passing element 112 is connected to one end of the ballast resistor 113, and the other end of the ballast resistor 113 is used as an output end of the bias circuit 110, and is used for outputting a bias current generated by the bias circuit 110.

The linearization circuit 120 includes a second capacitor 121. The second capacitor 121 can be any one of a metal coupling capacitor (MOM capacitor), a metal insulation capacitor (MIM capacitor) and a stack capacitor (STACK capacitor). One end of the second capacitor 121 is used as an input end of the linearization circuit 120, and is used for capturing a radio frequency signal of the power amplifier circuit 130. The other end of the second capacitor 121 is used as an output end of the linearization circuit 120. The output end is respectively connected to the first capacitor 116 and the base of the passing element 112 through a first node 111 in the bias circuit 110. Through the first node 111, the radio frequency signal of the power amplifier circuit 130 captured by the input end of the linearization circuit 120 is fed back to the bias circuit 110. The bias current can be generated by the bias circuit 110 according to the radio frequency signal, so that the nonlinear energy generated when the power amplifier circuit amplifies the radio frequency signal is inhibited, i.e., the linearity of a radio frequency signal output by a radio frequency signal output end of the power amplifier circuit 130 and the power-added efficiency of the power amplifier circuit 130 are increased.

The power amplifier circuit 130 includes a third capacitor 132 and a power transistor 131, wherein the power transistor 131 can be any one of a heterojunction bipolar transistor (HBT), a high-electron-mobility transistor (HEMT) or a pseudomorphic high-electron-mobility transistor (p-HEMT) manufactured on a GaAs substrate or a SiGe substrate. The power transistor 131 can also be a bipolar junction transistor (BJT). A connection relationship among all components in the power amplifier circuit 130 is shown as follows: one end of the third capacitor 132 is connected to a radio frequency signal input end, the other end of the third capacitor 132 is connected to a base of the power transistor 131, a collector of the power transistor 131 is respectively connected to an external power supply voltage and the radio frequency signal output end through a second node 133, and an emitter of the power transistor 131 is grounded. The input end of the linearization circuit 120 (one end of the second capacitor 121) is respectively connected to the radio frequency signal input end and one end of the third capacitor 132 through a third node 135. A radio frequency signal from the radio frequency signal input end of the power amplifier circuit 130 is captured by the linearization circuit 120 through the third node 135. The output end of the bias circuit 110 (the other end of the ballast resistor 113) is respectively connected to the third capacitor 132 and the base of the power transistor 131 through a fourth node 134. The bias current generated by the bias circuit 110 is input into the base of the power transistor 131 of the power amplifier circuit 130 through the fourth node 134, and is used for improving the linearity and power-added efficiency of the radio frequency signal output by the power amplifier circuit 130.

Embodiment 2

As shown in FIG. 4a-FIG. 6b, the radio frequency power amplifier module provided by the present embodiment includes a bias circuit 110, a linearization circuit 120 and a power amplifier circuit 130, wherein structures of the bias circuit 110 and the power amplifier circuit 130 and a connection relationship between the bias circuit 110 and the power amplifier circuit 130 are identical to those in Embodiment 1, and are not repeated herein. On the basis of the structure of the linearization circuit 120 in Embodiment 1, any component of a resistor 122, an inductor 123 and a third diode 124 is additionally added to form linearization circuits 120 in different structures. Energy of a radio frequency signal fed back to the bias circuit 110 under different conditions can be controlled through any component of the resistor 122, the inductor 123 and the third diode 124, and the goal of regulating the intensity of a bias current output by a passing element 112 of the bias circuit 110 is achieved. Different structures of the linearization circuit 120 provided by the present embodiment are concretely illustrated with reference to FIG. 4a-FIG. 6b hereafter.

Figure 4A:
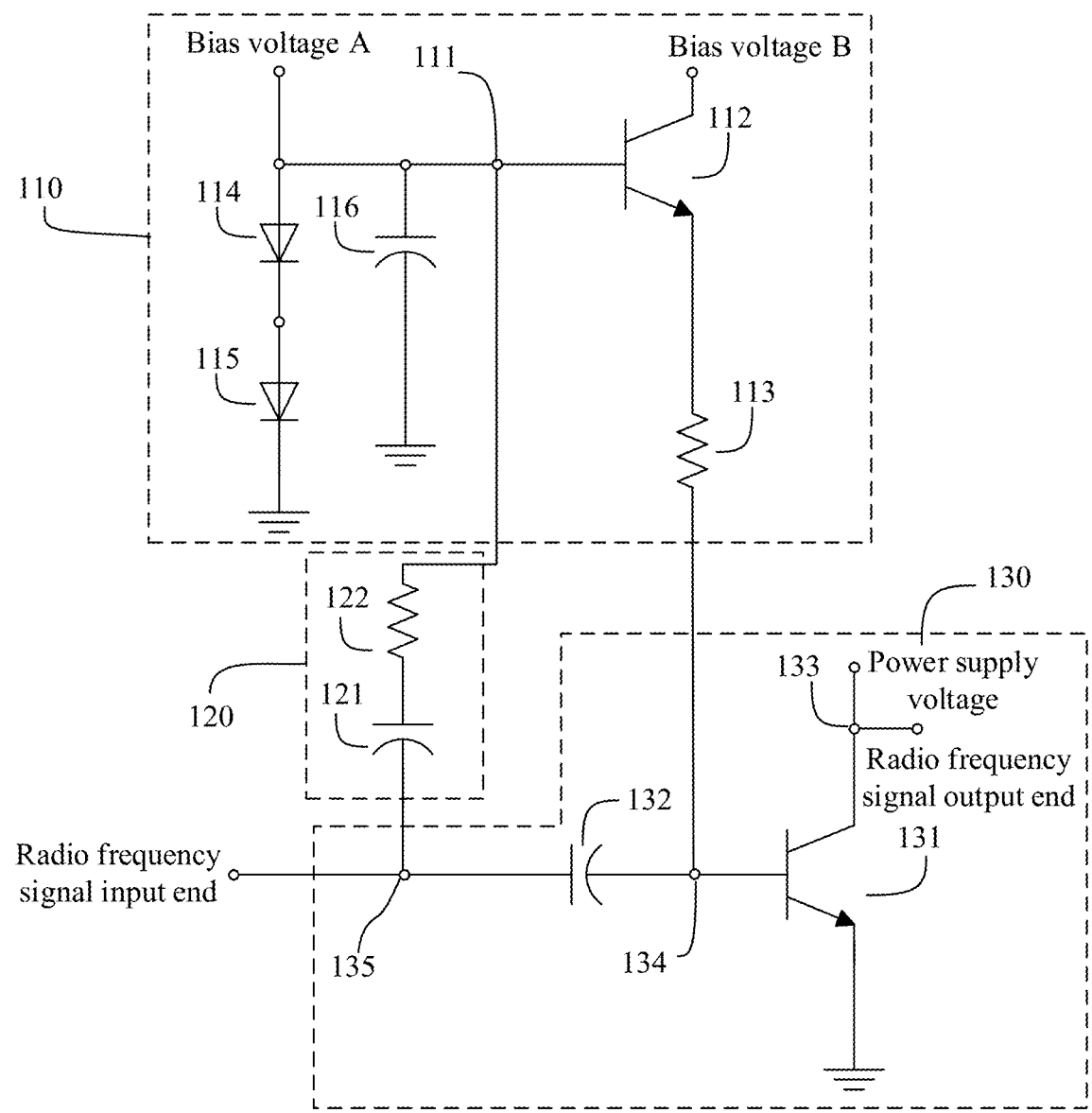
FIG. 4a-FIG. 6b are schematic structure diagrams of circuits of a radio frequency power amplifier module provided by Embodiment 2.
Figure 4B:
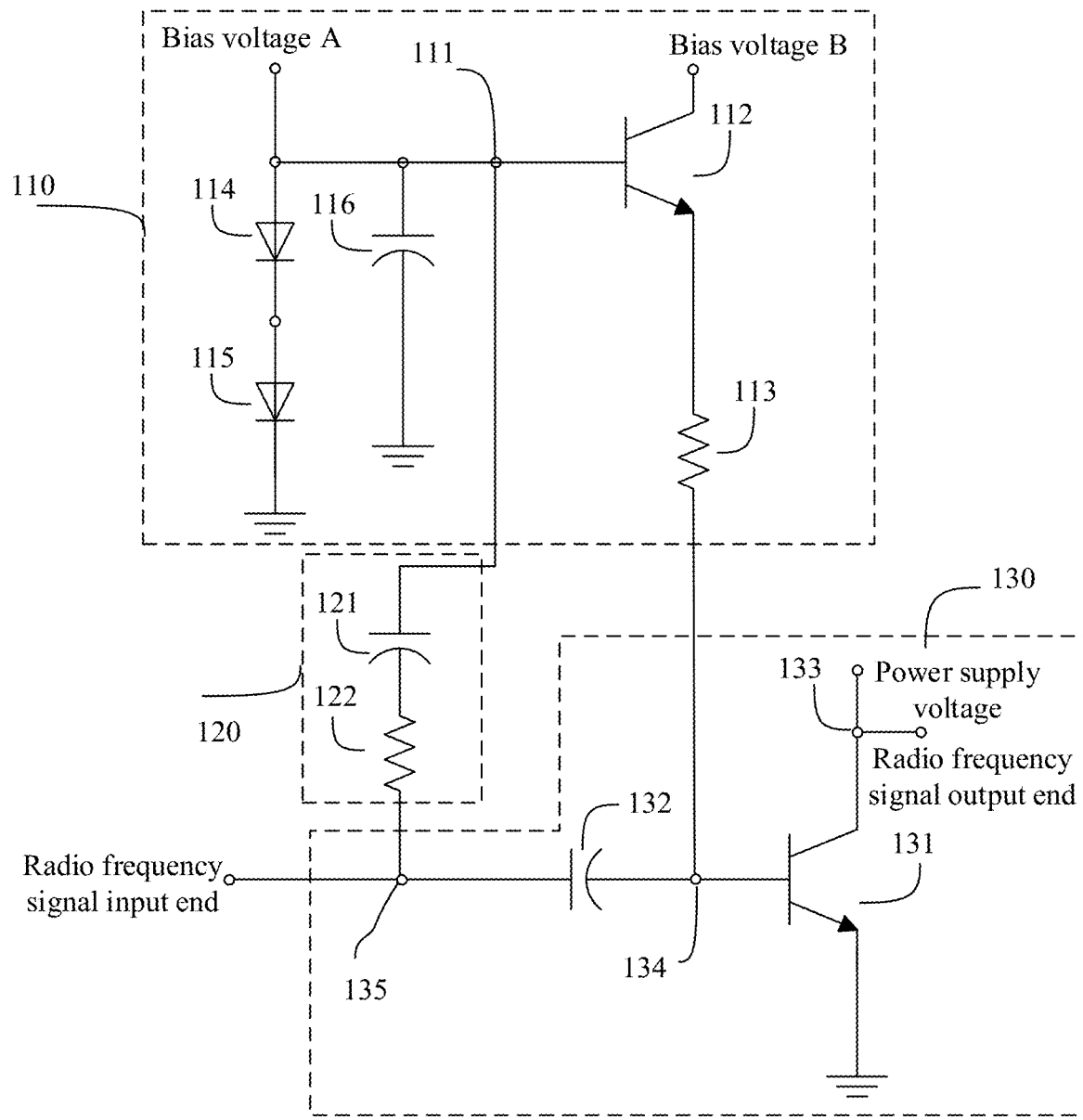
Figure 4C:
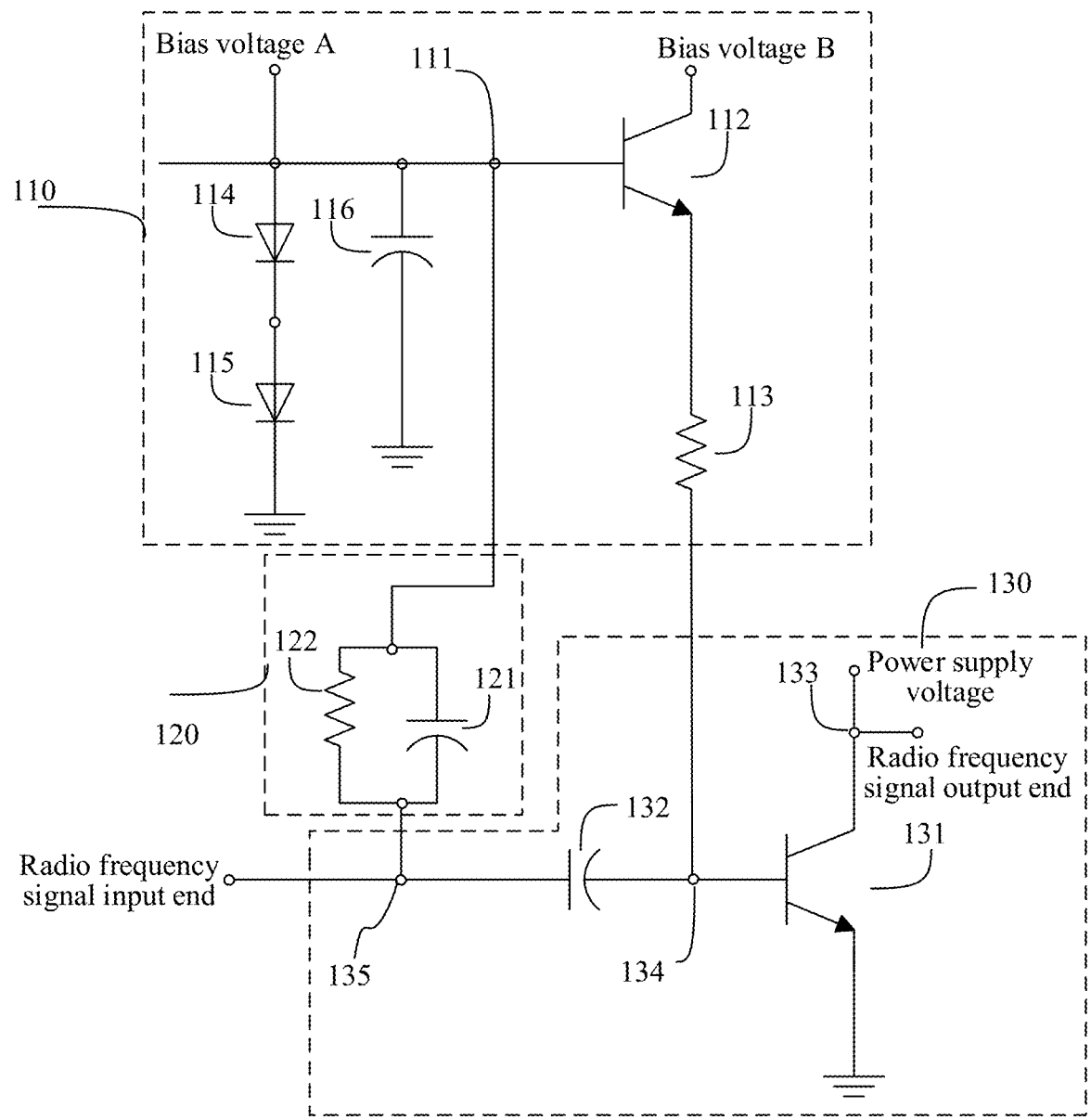

As shown in FIG. 4a-FIG. 4c, a first structure of the linearization circuit 120 includes a second capacitor 121 (the second capacitor 121 in Embodiment 1) and the resistor 122, wherein the second capacitor 121 can be connected in series or parallel to the resistor 122. Concretely, in the linearization circuit 120, as shown in FIG. 4a, one end of the second capacitor 121 can be used as an input end of the linearization circuit 120, the other end of the second capacitor 121 is connected to one end of the resistor 122, and the other end of the resistor 122 is used as an output end of the linearization circuit 120. As shown in FIG. 4b, one end of the resistor 122 is used as the input end of the linearization circuit 120, the other end of the resistor 122 is connected to one end of the second capacitor 121, and the other end of the second capacitor 121 is used as the output end of the linearization circuit 120. As shown in FIG. 4c, the resistor 122 is connected to one end of the second capacitor 121 to be used as the input end of the linearization circuit 120, and the resistor 122 is connected to the other end of the second capacitor 121 to be used as the output end of the linearization circuit 120. The energy of the radio frequency signal fed back to the bias circuit 110 is controlled through the linearization circuit 120, the intensity of a bias current output by the bias circuit 110 is further regulated, so that the nonlinear energy generated when the power amplifier circuit amplifies the radio frequency signal is inhibited, and the linearity and power-added efficiency of an output signal of the radio frequency power amplifier module are increased.

Figure 5A:
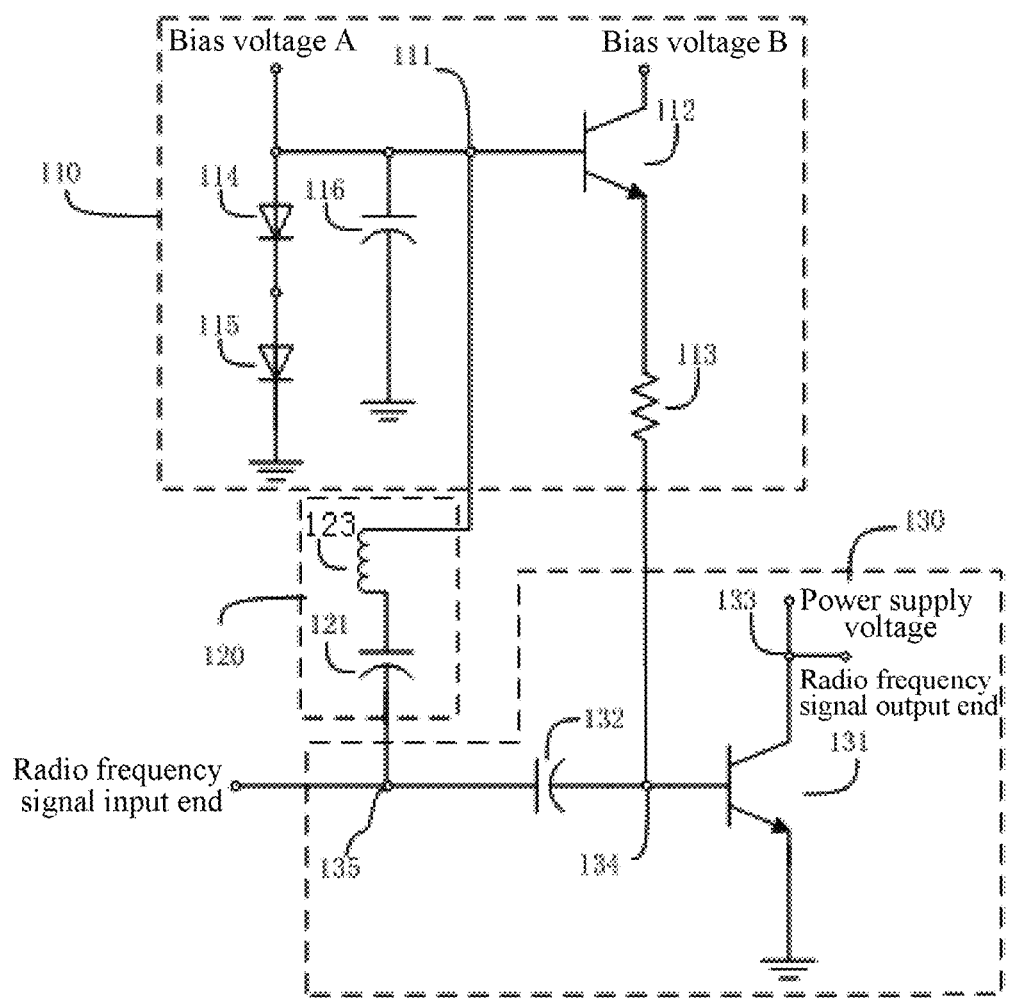
Figure 5B:
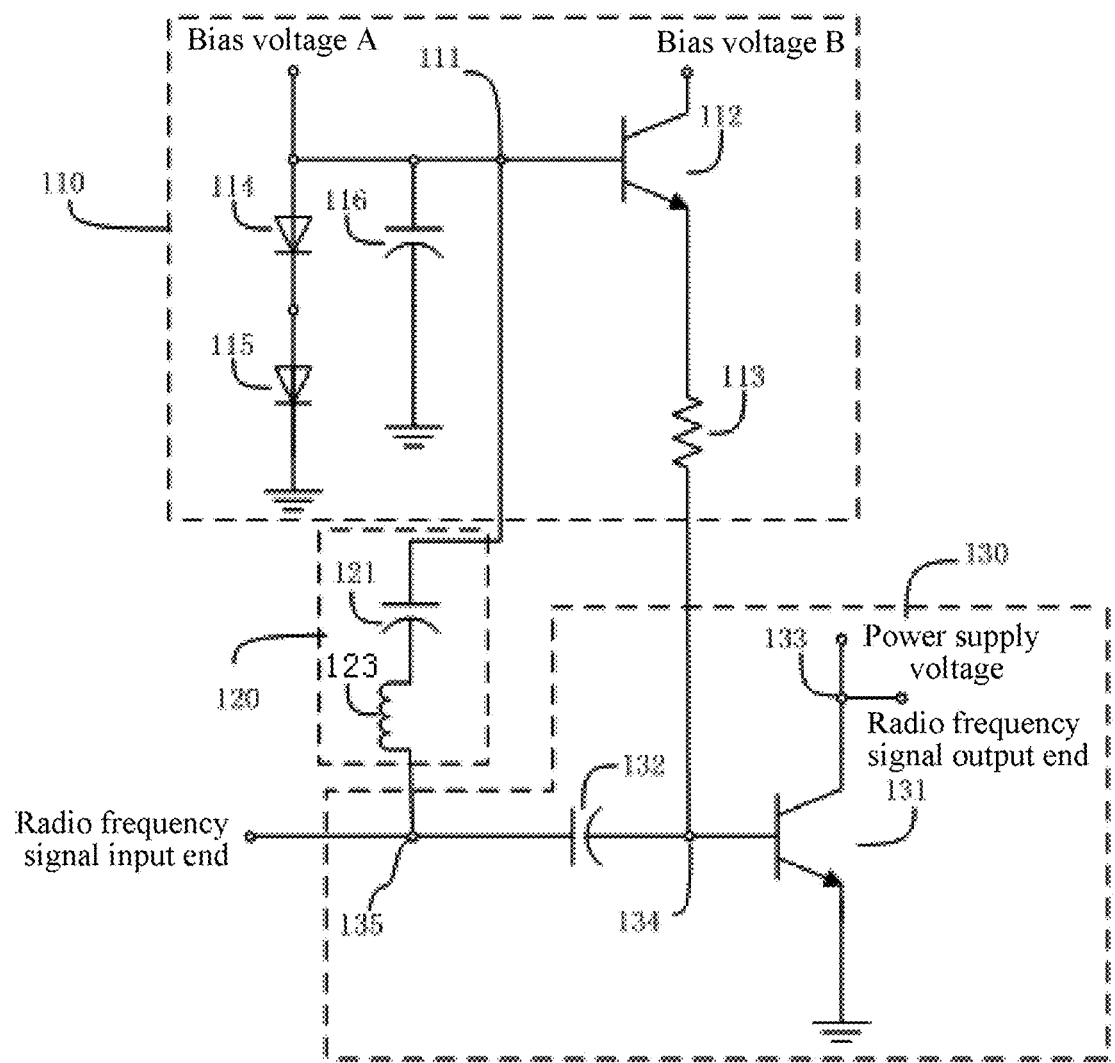

As shown in FIG. 5a and FIG. 5b, a second structure of the linearization circuit 120 includes the second capacitor 121 (the second capacitor 121 in Embodiment 1) and the inductor 123, wherein the second capacitor 121 and the inductor 123 are connected in series. Concretely, in the linearization circuit 120, as shown in FIG. 5a, one end of the second capacitor 121 can be used as the input end of the linearization circuit 120, the other end of the second capacitor 121 is connected to one end of the inductor 123, and the other end of the inductor 123 is used as the output end of the linearization circuit 120. As shown in FIG. 5b, one end of the inductor 123 is used as the input end of the linearization circuit 120, the other end of the inductor 123 is connected to one end of the second capacitor 121, and the other end of the second capacitor 121 is used as the output end of the linearization circuit 120. The energy of the radio frequency signal fed back to the bias circuit 110 in positions with different frequencies is controlled through the linearization circuit 120, and the intensity of the bias current output by the bias circuit 110 is further regulated, so that the nonlinear energy generated when the power amplifier circuit amplifies the radio frequency signal is inhibited, and the linearity and power-added efficiency of the output signal of the radio frequency power amplifier module are increased.

Figure 6A:
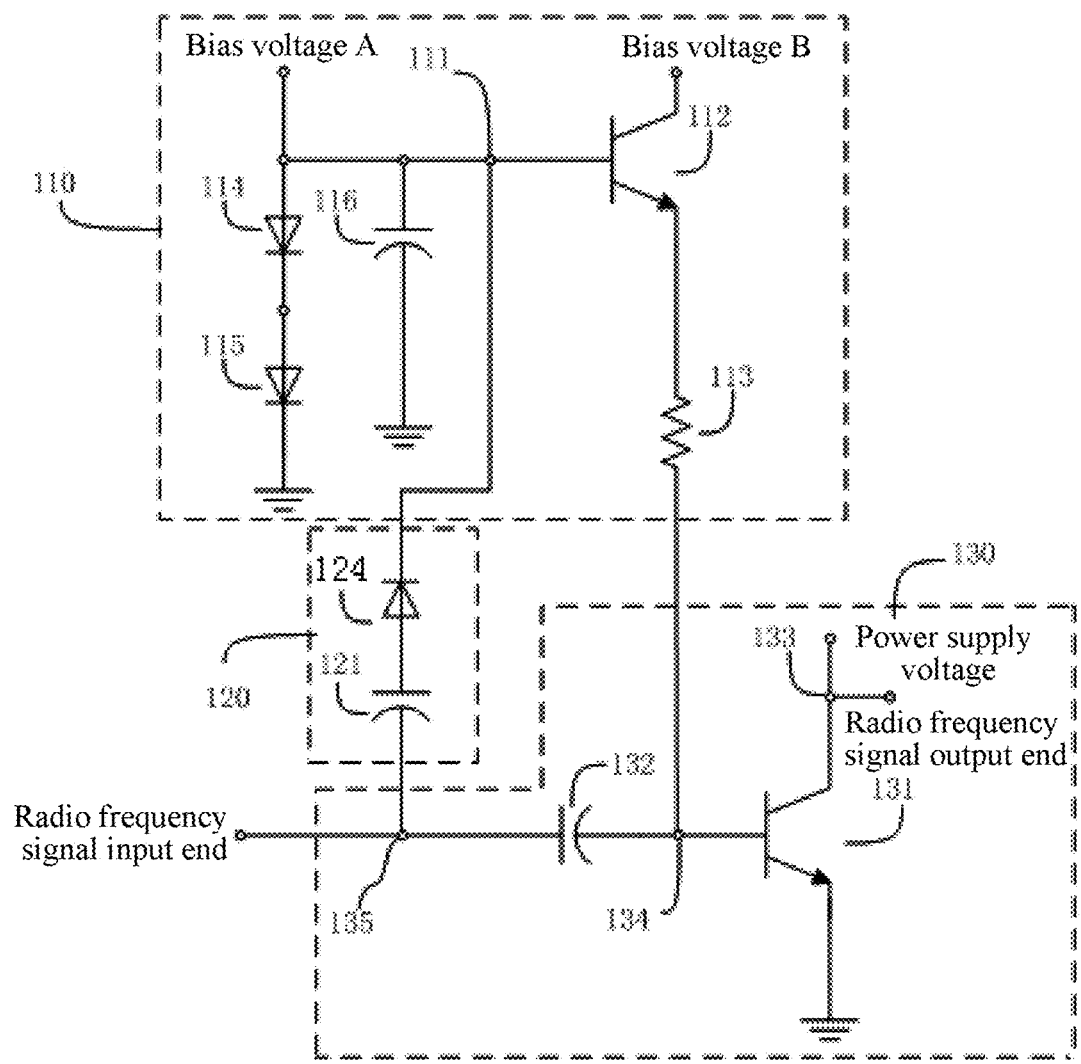
Figure 6B:
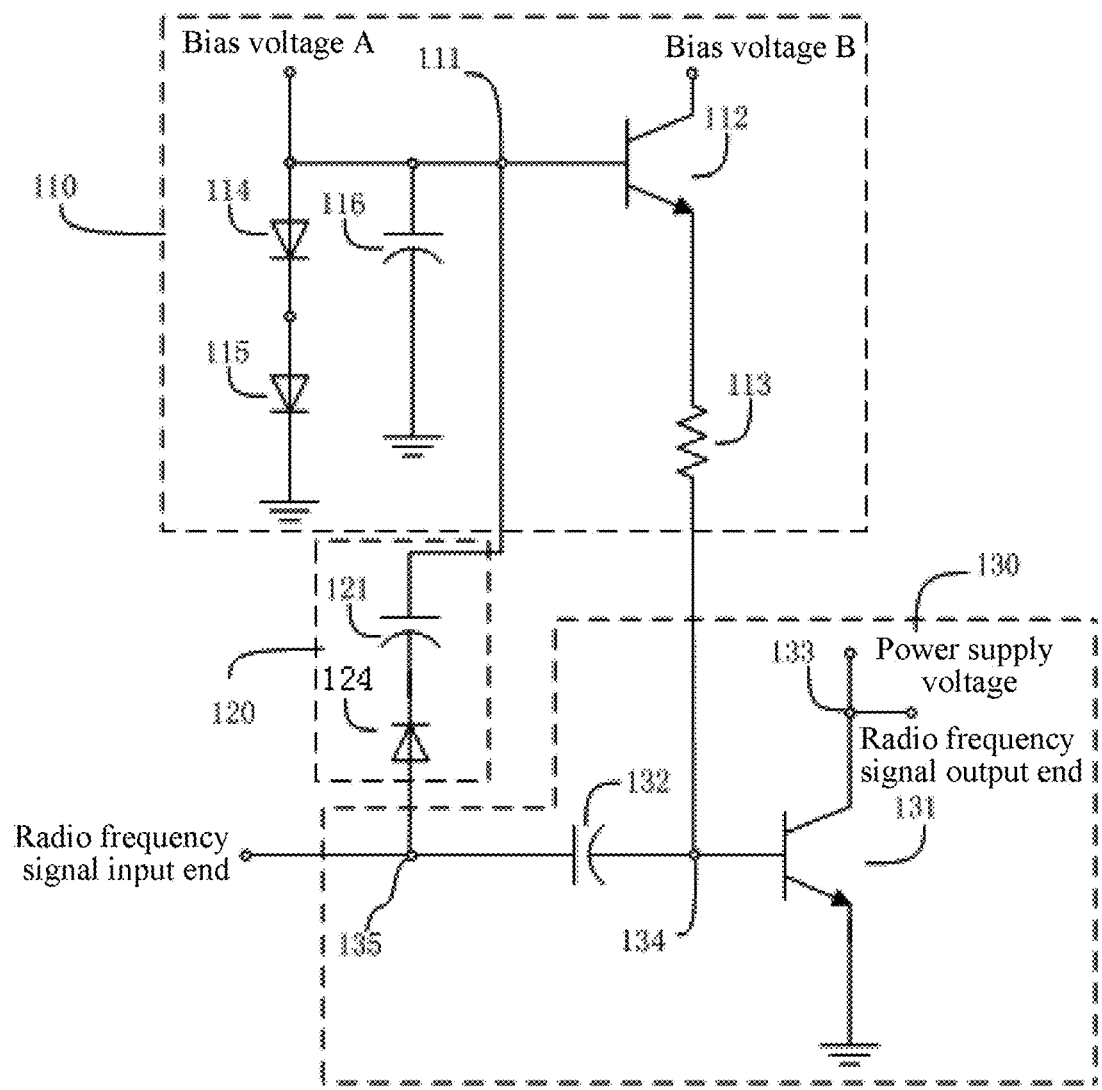

As shown in FIG. 6a and FIG. 6b, a third structure of the linearization circuit 120 includes the second capacitor 121 (the second capacitor 121 in Embodiment 1) and the third diode 124, wherein the second capacitor 121 and the third diode 124 are connected in series. Concretely, in the linearization circuit 120, as shown in FIG. 6a, one end of the second capacitor 121 can be used as the input end of the linearization circuit 120, the other end of the second capacitor 121 is connected with an anode of the third diode 124, and a cathode of the third diode 124 is used as the output end of the linearization circuit 120. As shown in FIG. 6b, the anode of the third diode 124 is used as the input end of the linearization circuit 120, the cathode of the third diode 124 is connected to one end of the second capacitor 121, and the other end of the second capacitor 121 is used as the output end of the linearization circuit 120. The energy of the radio frequency signal fed back to the bias circuit 110 at different radio frequency signal energy is controlled through the linearization circuit 120, and the intensity of the bias current output by the bias circuit 110 is further regulated, so that the nonlinear energy generated when the power amplifier circuit amplifies the radio frequency signal is inhibited, and the linearity and power-added efficiency of the output signal of the radio frequency power amplifier module are increased.

Similarly, the input end of the linearization circuit 120 is respectively connected to a radio frequency signal input end of the power amplifier circuit 130 and one end of a third capacitor 132 through a third node 135 in the power amplifier circuit 130, and the radio frequency signal from the radio frequency signal input end of the power amplifier circuit 130 is captured by the linearization circuit 120 through the third node 135. The output end of the linearization circuit 120 is respectively connected to a first capacitor 116 of the bias circuit 110 and a base of the passing element 112 through a first node 111. Through the first node 111, the radio frequency signal of the power amplifier circuit 130 captured by the input end of the linearization circuit 120 is fed back to the bias circuit 110. A bias current is generated according to the radio frequency signal through the bias circuit 110. The bias current is input into a base of a power transistor 131 of the power amplifier circuit 130 through a fourth node 134 in the power amplifier circuit 130, so that the linearity and power-added efficiency of the radio frequency signal output by the power amplifier circuit 130 are increased.

As is well-known, a first external bias voltage A and a second external bias voltage B are respectively provided for the bias circuit 110, and an external power supply voltage is provided for the power amplifier circuit 130, so that the power amplifier circuit 130 enters a standby state before amplifying the radio frequency signal. When the radio frequency signal is emitted into the power amplifier circuit 130, a signal amplitude of the radio frequency signal can randomly change in a modulation mode, if the power amplifier circuit 130 cannot perform equal-amplitude amplification on the radio frequency signal, a phenomenon of linearity worsening may occur. The concrete performance is that when the power amplifier circuit 130 amplifies the radio frequency signal, if a power gain curve of the power amplifier circuit 130 generates great-amplitude change along with an increase of the output power of the power amplifier circuit 130, the linearity of the radio frequency signal output by the power amplifier circuit 130 can fast worsen.

Figure 7:
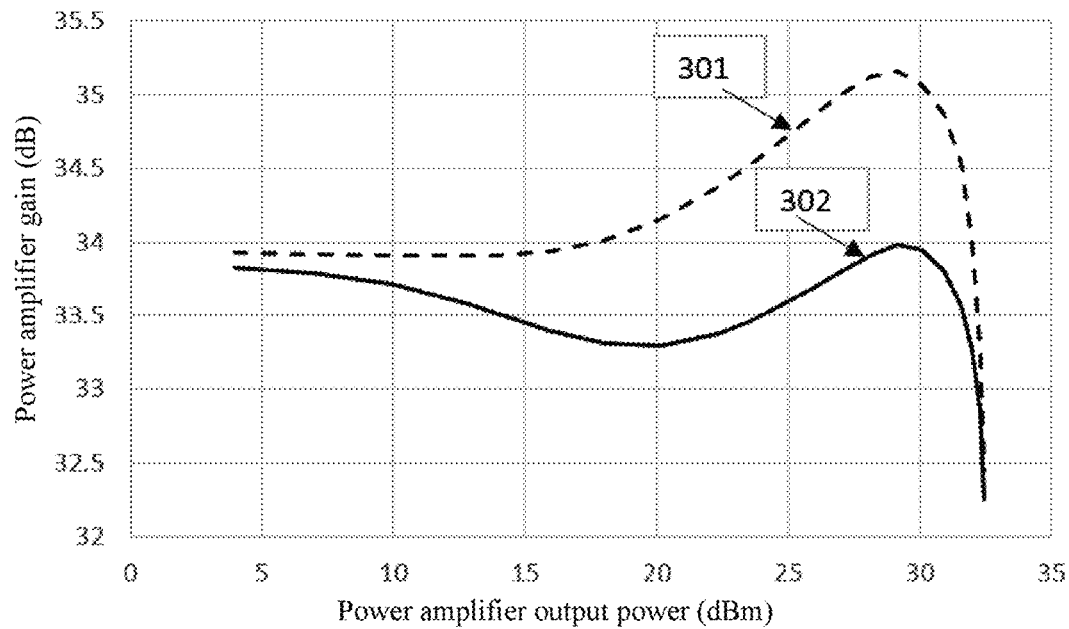
FIG. 7 is a curve diagram of regulation of a linearization circuit on power amplifier gain in the radio frequency power amplifier module provided by the present invention.
Figure 8:
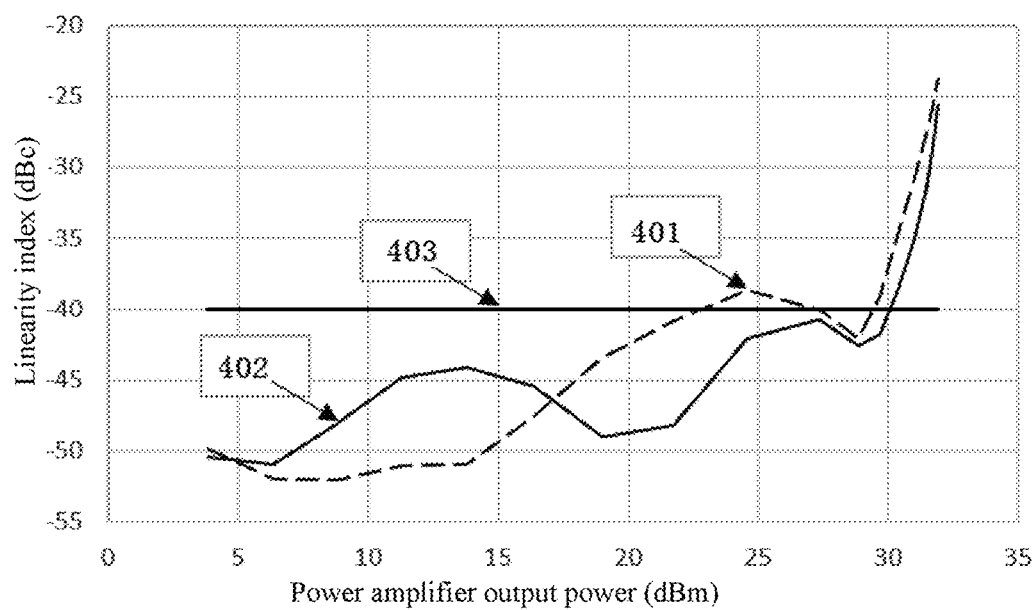
FIG. 8 is a curve diagram of regulation of a linearization circuit on power amplifier linearity in the radio frequency power amplifier module provided by the present invention.

In the curve diagrams of regulation of the linearization circuit on power amplifier gain and linearity in FIG. 7 and FIG. 8, a curve 301 is a gain curve of a power amplifier circuit 130 without the linearization circuit 120, and a curve 401 is an output linearity curve of the power amplifier circuit 130 without the linearization circuit 120. Seen from the curve 301 and the curve 401, it can be known that when the output power of the power amplifier circuit 130 is lower than 18 dBm, the power gain of the power amplifier circuit 130 is basically unchanged. At this moment, the output linearity of the power amplifier circuit 130 is lower than −45 dBc. When the output power of the power amplifier circuit 130 is higher than 18 dBm, an increase speed of the power gain of the power amplifier circuit 130 can be fast accelerated, at this moment, the output linearity of the power amplifier circuit 130 can fast worsen along with the increase of the output power of the power amplifier circuit 130, and the requirement of a linearity index curve 403 cannot be met when the output power of the power amplifier circuit 130 is between 23 dBm and 28 dBm. When the output power of the power amplifier circuit 130 is 28 dBm, the power gain of the power amplifier circuit 130 reaches a maximum value. When the output power of the power amplifier circuit 130 is within a range between 18 dBm and 28 dBm, the power gain of the power amplifier circuit 130 totally changes by 1.3 dB, the change amplitude is great, a nearly saturated power gain roll down point of the curve 301 is 28 dBm, and the power gain of the power amplifier circuit 130 can fast decrease when the output power of the power amplifier circuit 130 is higher than 28 dBm.

Similarly, as shown in FIG. 7 and FIG. 8, a curve 302 is a gain curve of the power amplifier circuit 130 with the linearization circuit 120. A curve 402 is an output linearity curve of the power amplifier circuit 130 with the linearization circuit 120. Seen from the curve 302 and the curve 402, when the output power of the power amplifier circuit 130 is lower than 20 dBm, the power gain of the power amplifier circuit 130 can be decreased by 0.5 dB. At this moment, the output linearity of the power amplifier circuit 130 is lower than −44 dBc. When the output power of the power amplifier circuit 130 is greater than 20 dBm, the power gain of the power amplifier circuit 130 can increase. At this moment, the output linearity of the power amplifier circuit 130 can worsen to a certain degree along with the increase of the output power of the power amplifier circuit 130, but the requirement of the linearity index curve 403 can be met. When the output power of the power amplifier circuit 130 equals to 30 dBm, the power gain of the power amplifier circuit 130 reaches the maximum. When the output power of the power amplifier circuit 130 is within a range between 20 dBm and 30 dBm, the power gain of the power amplifier circuit 130 totally changes by 0.7 dB, and the change amplitude is obviously smaller than that of the curve 301. A nearly saturated power gain roll down point of the curve 302 is 30 dBm. When the output power of the power amplifier circuit 130 is higher than 30 dBm, the power gain of the power amplifier circuit 130 can fast decrease. The nearly saturated power gain roll down point is greater than the nearly saturated power gain roll down point of the curve 301, so that the linearity curve 401 exceeds the linearity index curve 403 when the output power of the power amplifier circuit 130 is greater than 29 dBm, and the linearity curve 402 exceeds the requirement of the linearity index curve 403 when the output power of the power amplifier circuit 130 is greater than 30 dBm.

Figure 9:
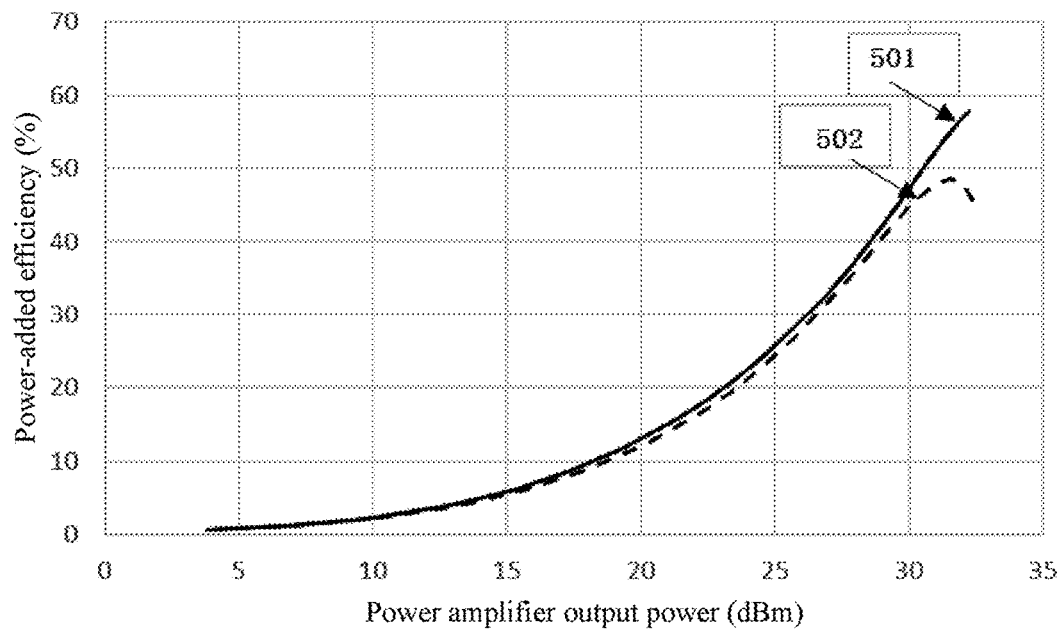
FIG. 9 is a curve diagram of regulation of a linearization circuit on power-added efficiency of a power amplifier in the radio frequency power amplifier module provided by the present invention.

In the curve diagram of regulation of the linearization circuit on power-added efficiency of a power amplifier in FIG. 9, a curve 501 is a power-added efficiency curve of the power amplifier circuit 130 without the linearization circuit 120. A curve 502 is a power-added efficiency curve of the power amplifier circuit 130 with the linearization circuit 120. When a radio frequency signal enters an input end of the power amplifier circuit 130 with the linearization circuit 120, the linearization circuit 120 can capture a part of energy of the radio frequency signal, and can feed back the energy of the radio frequency signal into the bias circuit 110 through the first node 111. Along with the increase of the energy of the radio frequency signal, the energy of the radio frequency signal fed back to the bias circuit 110 can also change. If the linearization circuit 120 provided by Embodiment 1 is used, the energy of the radio frequency signal fed back to the bias circuit 110 is increased, an output current of the passing element 112 in the bias circuit 110 can accordingly decrease, and a dynamic operating current of the power amplifier circuit 130 also accordingly decreases, so that the power gain of the power amplifier circuit 130 accordingly decreases, and the power-added efficiency of the power amplifier circuit 130 accordingly increases. If the linearization circuit 120 provided by Embodiment 2 is used, the energy of the radio frequency signal fed back to the bias circuit 110 can be controlled, the intensity of a bias current output by the passing element 112 of the bias circuit 110 is further regulated, and the goal of regulating the power-added efficiency of the power amplifier circuit 130 is achieved.

Figure 10A:
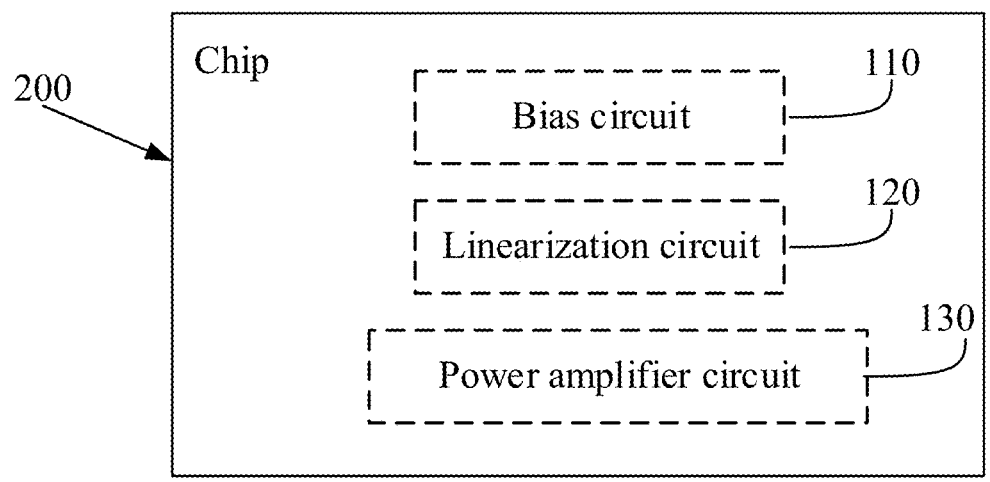
FIG. 10a-FIG. 10e are schematic diagrams of an implementation method of the radio frequency power amplifier module provided by the present invention.
Figure 10B:
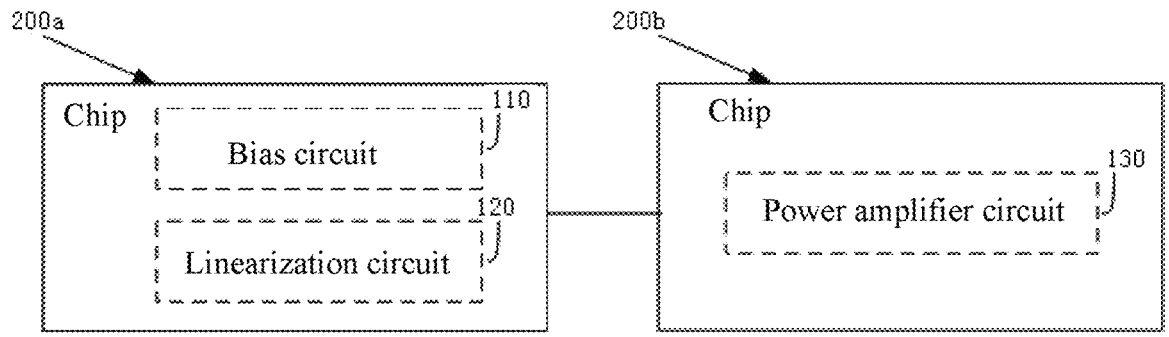
Figure 10C:
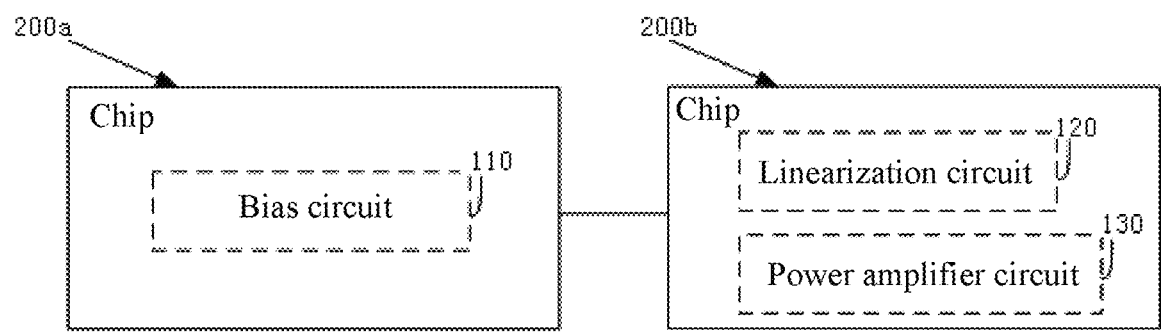
Figure 10D:
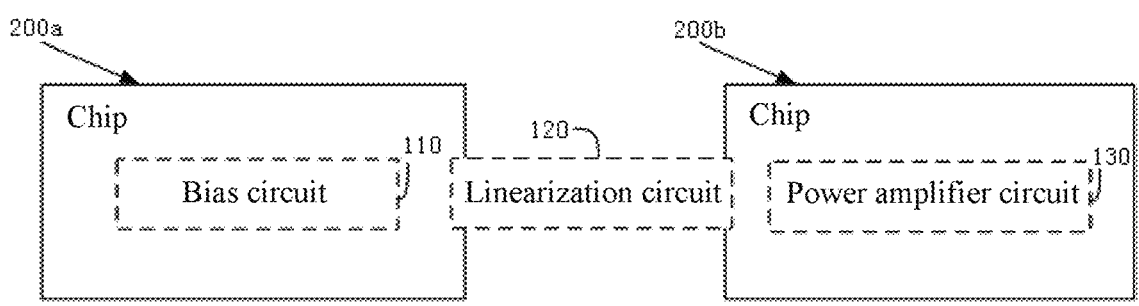
Figure 10E:
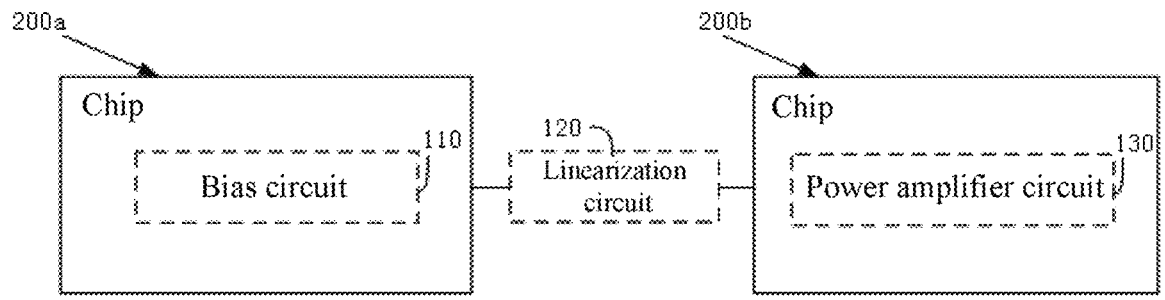

In the radio frequency power amplifier module provided by the present invention, the bias circuit 110, the linearization circuit 120 and the power amplifier circuit 130 have various concrete implementation modes. For example, as shown in FIG. 10a, the bias circuit 110, the linearization circuit 120 and the power amplifier circuit 130 can be designed and manufactured on a same chip 200. As shown in FIG. 10b, the bias circuit 110 and the linearization circuit 120 can be designed and manufactured on a chip 200a, the power amplifier circuit 130 is designed and manufactured on a chip 200b, and the radio frequency power amplifier module provided by the present invention is formed by correspondingly connecting the chip 200a and the chip 200b. As shown in FIG. 10c, the bias circuit 110 is designed and manufactured on the chip 200a, the linearization circuit 120 and the power amplifier circuit 130 are designed and manufactured on the chip 200b, and the radio frequency power amplifier module provided by the present invention is formed by correspondingly connecting the chip 200a and the chip 200b. As shown in FIG. 10d, the bias circuit 110 is designed and manufactured on the chip 200a, the power amplifier circuit 130 is designed and manufactured on the chip 200b, and the linearization circuit 120 is connected to the chip 200a and the chip 200b in a bridging way. As shown in FIG. 10e, the bias circuit 110 is designed and manufactured on the chip 200a, the power amplifier circuit 130 is designed and manufactured on the chip 200b, and the linearization circuit 120 is connected to the chip 200a and the chip 200b in a serial connection mode.

The radio frequency power amplifier module and the implementation method provided by the present invention can be applied to a multi-stage power amplifier structure, wherein at least one stage of radio frequency power amplifier is provided with the linearization circuit. The way of how to use the radio frequency power amplifier module into the multi-stage power amplifier structure is concretely illustrated hereafter by using a two-stage radio frequency power amplifier of the multi-stage power amplifier as a typical embodiment.

Figure 11:
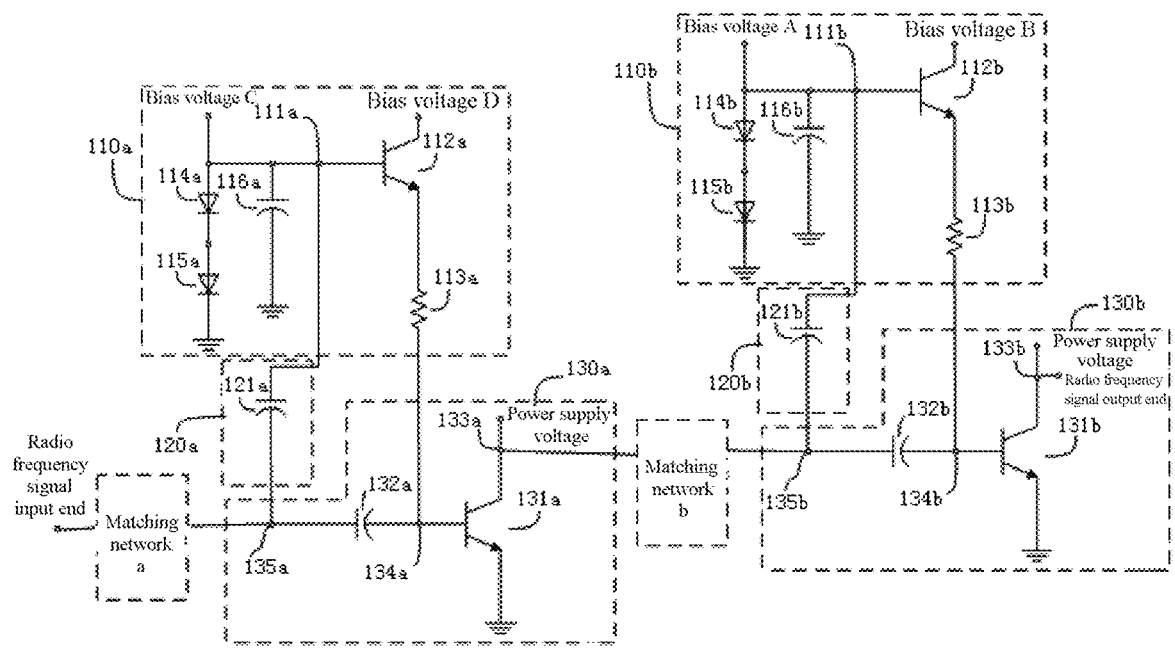
FIG. 11 is a schematic structure diagram of the radio frequency power amplifier module provided by the present invention, in which two stages of radio frequency power amplifiers are provided with linearization circuits.

As shown in FIG. 11, two radio frequency power amplifier modules provided by Embodiment 1 are coupled through an output matching network b, wherein a first radio frequency power amplifier module includes a bias circuit 110a, a linearization circuit 120a and a power amplifier circuit 130a. The bias circuit 110a includes a first diode 114a, a second diode 115a, a first capacitor 116a, a passing element 112a and a ballast resistor 113a. The linearization circuit 120a includes a second capacitor 121a. The power amplifier circuit 130a includes a third capacitor 132a and a power transistor 131a. A second radio frequency power amplifier module includes a bias circuit 110b, a linearization circuit 120b and a power amplifier circuit 130b. The bias circuit 110b includes a first diode 114b, a second diode 115b, a first capacitor 116b, a passing element 112b and a ballast resistor 113b. The linearization circuit 120b includes a second capacitor 121b. The power amplifier circuit 130b includes a third capacitor 132b and a power transistor 131b. The structures of the two radio frequency power amplifier module are the same as that shown in Embodiment 1, and are not repeated herein. A matching network a is arranged between a radio frequency signal input end and a node 135a of the first radio frequency power amplifier module. The matching network is used as an input matching network of a power amplifier 130a, and is used for filtering away interference in a radio frequency signal and realizing impedance matching. When the radio frequency signal is emitted to the power amplifier circuit 130a, the linearization circuit 120a will capture the radio frequency signal through the node 135a, and feed back the radio frequency signal to the bias circuit 110a through a node 111a. The bias circuit 110a generates a corresponding bias current according to the fed back radio frequency signal, and the bias current is input into the power amplifier circuit 130a through a node 134a, so that the linearity and power-added efficiency of the power amplifier circuit 130a are increased. A radio frequency signal output by the power amplifier circuit 130a is coupled to the second radio frequency power amplifier module through the matching network. At this moment, the linearization circuit 120b captures the radio frequency signal through a node 135b, and feeds back the radio frequency signal into the bias circuit 110b through a node 111b. The bias circuit 110b generates a corresponding bias current according to the fed back radio frequency signal, and the bias current is input into the power amplifier circuit 130b through a node 134b, so that nonlinear energy generated when the power amplifier circuit 130b amplifies the radio frequency signal is inhibited, and the linearity and power-added efficiency of the radio frequency power amplifier circuit 130b are increased.

A structure shown in FIG. 11 can also be evolved into another two structures. One of the structures is that: after the linearization circuit 120a in the first radio frequency power amplifier module is removed, the first radio frequency power amplifier module is coupled with the second radio frequency power amplifier module through the matching network b. Another structure is that: after the linearization circuit 120b in the second radio frequency power amplifier module is removed, the second radio frequency power amplifier module is coupled with the first radio frequency power amplifier module through the matching network b. The operating principle of the two structures is identical to those mentioned above and is not repeated herein.

According to the radio frequency power amplifier module provided by the present invention, the linearization circuit is arranged between the power amplifier circuit and the bias circuit, a radio frequency signal input from a radio frequency signal input end of the power amplifier circuit is captured by the linearization circuit, the captured radio frequency signal is fed back to the bias circuit, and a corresponding bias current is generated by the bias circuit according to the fed back radio frequency signal. The bias current is input into the power amplifier circuit, and the linearity and power-added efficiency of an output signal of the radio frequency of the power amplifier module are increased. Meanwhile, the linearization circuits in different structures are used for controlling energy of the radio frequency signal fed back to the bias circuit under different conditions, and the intensity of the bias current output by the bias circuit is further regulated, so that nonlinear energy generated when the power amplifier circuit amplifies the radio frequency signal is inhibited.

Additionally, the radio frequency power amplifier module and the implementation method provided by the present invention can also be applied to a multi-stage power amplifier, thereby improving the linearity and power-added efficiency of the multi-stage radio frequency power amplifier.

The radio frequency power amplifier module having high linearity and power-added efficiency and the implementation method provided in the present invention have been described in detail above. Any obvious modification made by those of ordinary skill in the art to the present invention without departing from the essential of the present invention shall all fall within the protection scope of the present invention.

What is claimed is:

1. A radio frequency power amplifier module having high linearity and power-added efficiency, comprising a bias circuit, a linearization circuit and a power amplifier circuit, wherein the power amplifier circuit is connected to the linearization circuit, the linearization circuit is connected to the bias circuit, and the bias circuit is connected to the power amplifier circuit;

the bias circuit comprises a first diode, a second diode, a first capacitor, a passing element and a ballast resistor, an anode of the first diode is respectively connected to a first external bias voltage, one end of the first capacitor and a base of the passing element, a cathode of the first diode is connected to an anode of the second diode, a cathode of the second diode and other end of the first capacitor are respectively grounded, a collector of the passing element is connected to a second external bias voltage, an emitter of the passing element is connected to one end of the ballast resistor, and an output end of the linearization circuit is connected to the bias circuit through a first node in the bias circuit;

the linearization circuit comprises a second capacitor, one end of the second capacitor is used as an input end of the linearization circuit and is used for capturing a radio frequency signal of the power amplifier circuit, the other end of the second capacitor is used as an output end of the linearization circuit the output end of the linearization circuit is respectively connected to the base of the passing element, so the radio frequency signal of the power amplifier circuit captured by the input end of the linearization circuit is fed back to the bias circuit; and energy of a radio frequency signal fed back to the bias circuit is controlled through the linearization circuit, and the intensity of a bias current output by the bias circuit is further regulated.

2. The radio frequency power amplifier module according to claim 1, wherein
the linearization circuit is formed by connecting any one of a resistor, an inductor and a third diode to the second capacitor in series, or the linearization circuit is formed by connecting the second capacitor and the resistor in parallel.

3. The radio frequency power amplifier module according to claim 2, wherein
the second capacitor is any one of a metal coupling capacitor, a metal insulation capacitor and a stack capacitor.

4. The radio frequency power amplifier module according to claim 1, wherein
the power amplifier circuit comprises a third capacitor and a power transistor, one end of the third capacitor is connected to a radio frequency signal input end, other end of the third capacitor is connected to a base of the power transistor, a collector of the power transistor is respectively connected to an external power supply voltage and a radio frequency signal output end through a second node, an emitter of the power transistor is grounded, and the power amplifier circuit is respectively connected to an input end of the linearization circuit and an output end of the bias circuit through a third node and a fourth node in the power amplifier circuit.

5. The radio frequency power amplifier module according to claim 1, wherein
the passing element or the power transistor comprises any one of a heterojunction bipolar transistor, a high-electron-mobility transistor or a pseudomorphic high-electron-mobility transistor, and a bipolar junction transistor.

6. The radio frequency power amplifier module according to claim 1, wherein the bias circuit, the linearization circuit and the power amplifier circuit are respectively and correspondingly arranged on one or a plurality of chips, when the bias circuit and the power amplifier circuit are respectively and correspondingly arranged on two chips, a chip on which the bias circuit is located and a chip on which the power amplifier circuit is located are connected to the linearization circuit in a bridging or serial connection mode.

7. The radio frequency power amplifier module according to claim 1, wherein
when the radio frequency power amplifier module is a multi-stage radio frequency power amplifier, at least one stage of radio frequency power amplifier is provided with the linearization circuit.

* * * * *